US010197910B2

(12) United States Patent
Yamaguchi et al.

(10) Patent No.: US 10,197,910 B2
(45) Date of Patent: Feb. 5, 2019

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Hiromitsu Yamaguchi, Yokohama (JP); Yoshikazu Miyajima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 478 days.

(21) Appl. No.: 14/732,219

(22) Filed: Jun. 5, 2015

(65) Prior Publication Data

US 2015/0352756 A1    Dec. 10, 2015

(30) Foreign Application Priority Data

Jun. 10, 2014  (JP) ................................ 2014-119892

(51) Int. Cl.
    *B29C 43/58*    (2006.01)
    *B29C 43/18*    (2006.01)
    *G03F 7/00*     (2006.01)

(52) U.S. Cl.
    CPC .................. *G03F 7/0002* (2013.01)

(58) Field of Classification Search
    CPC .................................... G03F 7/0002
    (Continued)

(56) References Cited

U.S. PATENT DOCUMENTS 6,169,605 B1 * 1/2001 Penn ..................... B33Y 50/00
                                                        358/1.1
7,045,699 B2   5/2006 Okabayashi
                          (Continued)

FOREIGN PATENT DOCUMENTS

JP    2004120697 A    4/2004
JP    2008502157 A    1/2008
                    (Continued)

OTHER PUBLICATIONS

Notice of Preliminary Rejection issued in Korean Patent Application No. 10-2015-0081090 dated Jun. 5, 2017.
(Continued)

*Primary Examiner* — Nahida Sultana
(74) *Attorney, Agent, or Firm* — Rossi, Kimms & McDowell LLP

(57) ABSTRACT

The present invention provides an imprint apparatus which forms a pattern of an imprint material on a substrate using a mold, comprising a supply unit including a plurality of orifices and configured to supply the imprint material on the substrate by discharging the imprint material from each orifice, and a control unit configured to control the discharge of the imprint material from each orifice in accordance with arrangement information showing an arrangement of the imprint material on the substrate, wherein the control unit updates the arrangement information to bring a product of an ideal volume of the imprint material discharged from each orifice in one-time discharge and the number of discharges of the imprint material supplied on the substrate from the supply unit closer to a total amount of the imprint material actually supplied on the substrate in accordance with the arrangement information.

34 Claims, 8 Drawing Sheets

(58) Field of Classification Search
USPC ..... 264/293, 219, 40.1; 425/174.4, 385, 141
See application file for complete search history.

(56) References Cited

U.S. PATENT DOCUMENTS

| | | | |
|---|---|---|---|
| 8,392,855 B2 | 3/2013 | Morinaga et al. | |
| 8,560,977 B2 | 10/2013 | Matsuoka et al. | |
| 8,691,123 B2 | 4/2014 | Nakagawa et al. | |
| 8,740,377 B2 | 6/2014 | Mikami et al. | |
| 9,067,446 B1* | 6/2015 | Moore | B41J 2/16535 |
| 2002/0096112 A1* | 7/2002 | Coe | B29C 67/0059 |
| | | | 118/663 |
| 2003/0198789 A1* | 10/2003 | Koyama | B41J 2/2132 |
| | | | 428/195.1 |
| 2004/0261701 A1* | 12/2004 | Kobayashi | B05C 5/0216 |
| | | | 118/696 |
| 2005/0053798 A1* | 3/2005 | Maekawa | B33Y 40/00 |
| | | | 428/542.8 |
| 2005/0211163 A1* | 9/2005 | Li | C23C 24/00 |
| | | | 118/308 |
| 2005/0270312 A1 | 12/2005 | Lad et al. | |
| 2010/0097590 A1 | 4/2010 | Schumaker | |
| 2011/0206832 A1* | 8/2011 | Obata | B41J 2/2135 |
| | | | 427/58 |
| 2011/0212262 A1* | 9/2011 | Miyasaka | B29C 47/065 |
| | | | 427/258 |
| 2012/0072003 A1 | 3/2012 | Matsuoka et al. | |
| 2013/0249981 A1 | 9/2013 | Nakagawa et al. | |
| 2013/0251906 A1 | 9/2013 | Takimoto | |
| 2014/0199472 A1 | 7/2014 | Kodama et al. | |
| 2015/0273769 A1* | 10/2015 | Korn | B29C 67/0088 |
| | | | 264/405 |
| 2015/0273770 A1* | 10/2015 | Bajaj | B24B 37/26 |
| | | | 425/166 |
| 2015/0321420 A1* | 11/2015 | Karpas | B33Y 30/00 |
| | | | 425/3 |
| 2015/0352787 A1* | 12/2015 | Humbert | B29C 67/0085 |
| | | | 264/489 |
| 2016/0161868 A1* | 6/2016 | Asada | G03F 7/0002 |
| | | | 264/40.1 |
| 2016/0288378 A1* | 10/2016 | Arai | G03F 7/0002 |
| 2017/0015045 A1* | 1/2017 | Yamaguchi | B41J 3/407 |

FOREIGN PATENT DOCUMENTS

| | | |
|---|---|---|
| JP | 2012033769 A | 2/2012 |
| JP | 2012054322 A | 3/2012 |
| JP | 2012506600 A | 3/2012 |
| JP | 2012069701 A | 4/2012 |
| JP | 2012069818 A | 4/2012 |
| JP | 2012114157 A | 6/2012 |
| JP | 2012213761 A | 11/2012 |
| JP | 2013065624 A | 4/2013 |
| JP | 2013197389 A | 9/2013 |
| JP | 2013201278 A | 10/2013 |
| KR | 1020110078908 A | 7/2011 |
| KR | 1020140032272 A | 3/2014 |
| KR | 1020140068977 A | 6/2014 |
| WO | 2010047766 A1 | 4/2010 |

OTHER PUBLICATIONS

Office Action issued in Japanese Appln. No. 2014-119892 dated Aug. 25, 2017.

* cited by examiner

FIG. 6
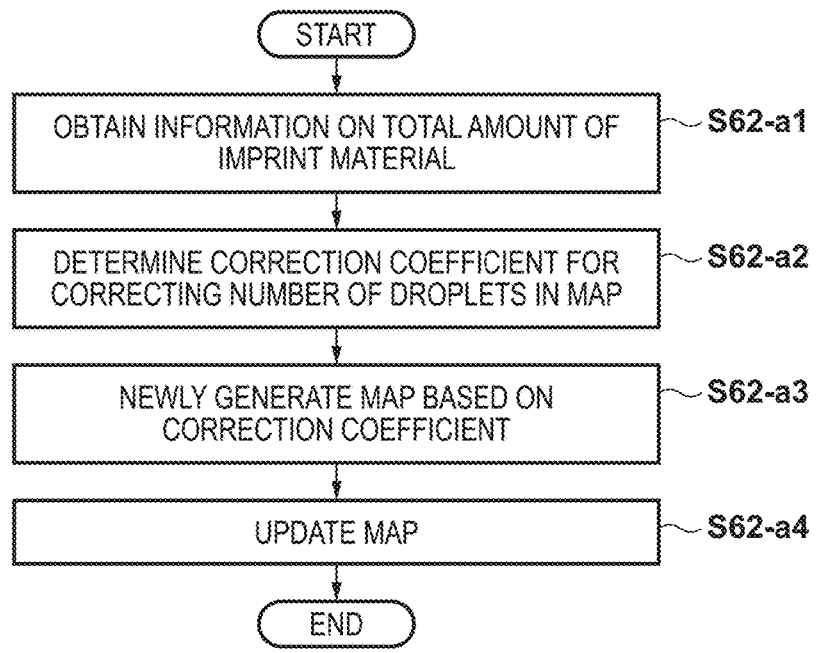
FIG. 7
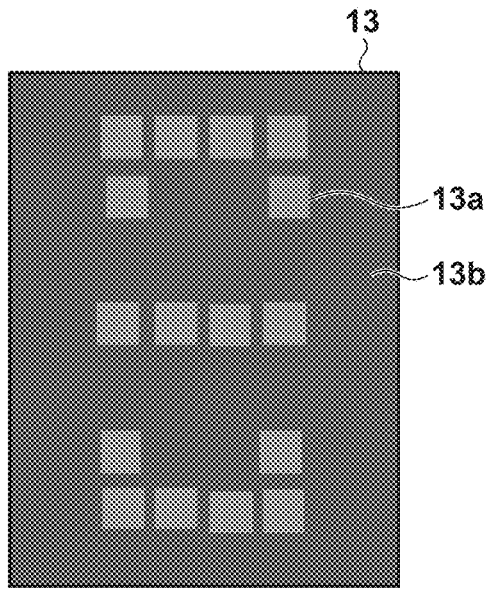
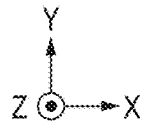
FIG. 8
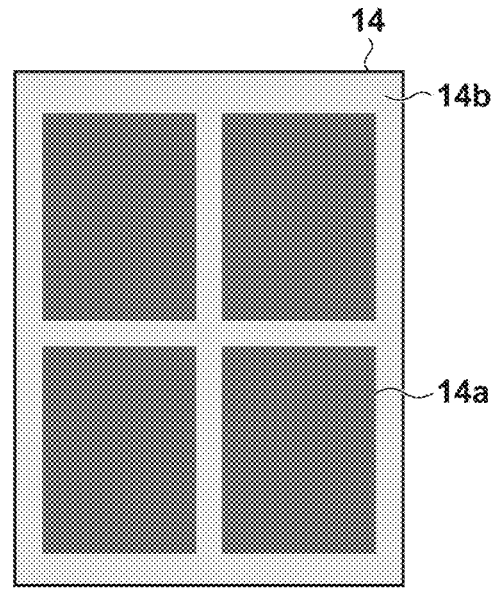
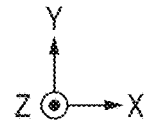

FIG. 11
FIRST MOLD
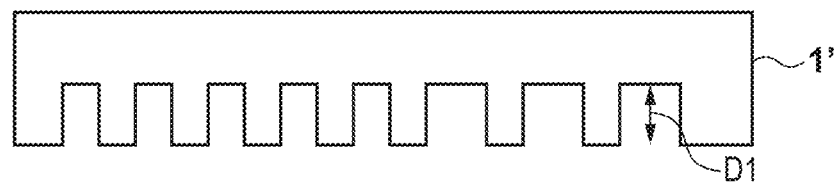
SECOND MOLD
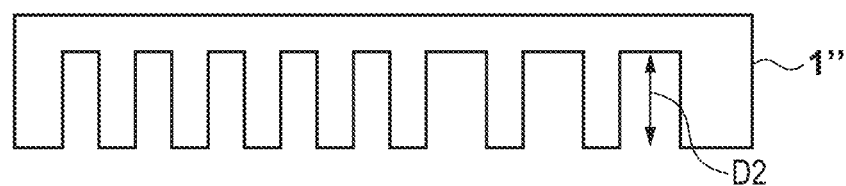
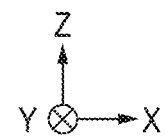

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus which forms an imprint material on a substrate using a mold has received attention as one of lithography apparatuses for mass-producing semiconductor devices or the like. The imprint apparatus includes a plurality of nozzles which discharge droplets of the imprint material toward the substrate. The imprint apparatus supplies the imprint material on the substrate by controlling discharge of the droplet from each nozzle in accordance with a map showing the arrangement on the substrate of the droplet which should be supplied on the substrate.

In the imprint apparatus, the volume of each droplet actually discharged from each nozzle may be different from an ideal volume (target volume) owing to a manufacturing variation in the nozzle or the like. In this case, the thickness of the imprint material after being formed using the mold may fall outside an allowable range. Japanese Patent Laid-Open No. 2013-65624 proposes an imprint apparatus capable of individually adjusting the discharge amount of an imprint material discharged as a droplet from each nozzle.

The imprint apparatus described in Japanese Patent Laid-Open No. 2013-65624 controls the driving voltage of each nozzle individually so that the volume of each droplet discharged from each nozzle becomes an ideal volume. However, this may complicate a circuit arrangement for controlling each nozzle and control of each nozzle when supplying the imprint material on a substrate.

SUMMARY OF THE INVENTION

The present invention provides an imprint apparatus advantageous in, for example, supplying an imprint material of a target amount on a substrate.

According to one aspect of the present invention, there is provided an imprint apparatus which forms a pattern of an imprint material on a substrate using a mold, the apparatus comprising: a supply unit including a plurality of orifices which discharge the imprint material toward the substrate and configured to supply the imprint material on the substrate by discharging the imprint material from each orifice; and a control unit configured to control the discharge of the imprint material from each orifice in accordance with arrangement information showing an arrangement, on the substrate, of the imprint material which should be supplied on the substrate from the supply unit, wherein the control unit updates, based on information on a total amount of the imprint material actually supplied on the substrate in accordance with the arrangement information, the arrangement information to bring a product of an ideal volume of the imprint material discharged from each orifice in one-time discharge and the number of discharges of the imprint material supplied on the substrate from the supply unit closer to the total amount of the imprint material in the information.

Further features of the present invention will become apparent from the following description of exemplary embodiments with reference to the attached drawings.

BRIEF DESCRIPTION OF THE DRAWINGS

FIG. 6 is a flowchart of map update according to the first embodiment;

FIG. 7 is a view showing the thickness distribution of an imprint material;

FIG. 8 is a view showing a correction distribution;

FIG. 11 is a view showing the first mold and the second mold.

DESCRIPTION OF THE EMBODIMENTS

Figure 1:
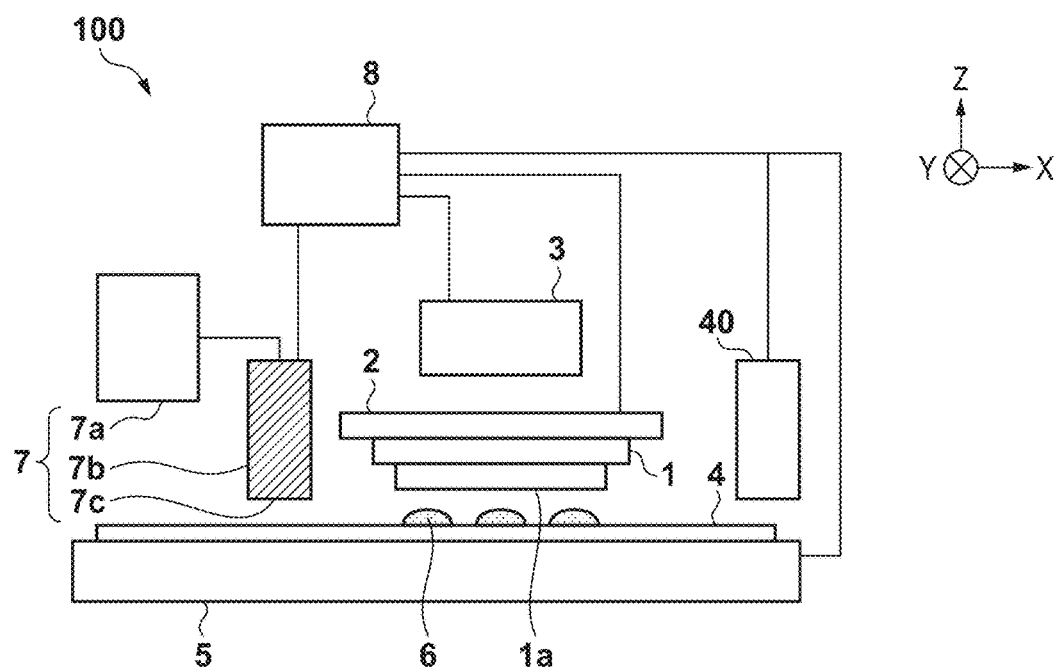
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described. The imprint apparatus 100 is used to manufacture a semiconductor device or the like and performs an imprint process of forming an imprint material 6 on a substrate using a mold 1. For example, the imprint apparatus 100 cures the imprint material 6 in a state in which the mold 1, on which a concave-convex pattern has been formed, is brought into contact with the imprint material 6 on the substrate. Then, the imprint apparatus 100 can form a pattern formed by the imprint material 6 on the substrate by widening the spacing between the mold 1 and a substrate 4, and separating (releasing) the mold 1 from the cured imprint material 6. A method of curing the imprint material 6 includes a heat cycle method using heat and a photo-curing method using light. In the first embodiment, an example in which the photo-curing method is adopted will be described. The photo-curing method is a method of curing the imprint material 6 by supplying an uncured ultraviolet-curing resin as the imprint material 6 on the substrate, and irradiating the imprint material 6 with ultraviolet rays in a state in which the mold 1 and the imprint material 6 are in contact with each other. A case in which the ultraviolet rays are used as light will be described here. However, light having a different wavelength may be used.

[Configuration of Imprint Apparatus]

FIG. 1 is a schematic diagram showing the imprint apparatus 100 according to the first embodiment. The imprint apparatus 100 can include a mold stage 2 which holds the mold 1, a substrate stage 5 which holds the substrate 4, and a curing unit 3 which cures the imprint material 6 on the substrate by irradiating it with light. The imprint apparatus 100 can also include a supply unit 7 which supplies the imprint material 6 to the substrate 4 and a control unit 8. The control unit 8 includes, for example, a CPU and a memory, and controls the imprint process (controls the respective units of the imprint apparatus 100).

The mold 1 is normally made of a material such as quartz capable of transmitting ultraviolet rays. A concave-convex pattern for forming the imprint material 6 on the substrate is formed in a partial region (pattern region 1*a*) on a surface on the substrate side of the mold 1. As the substrate 4, for example, a single-crystal silicon substrate, an SOI (Silicon on Insulator) substrate, or the like can be used. The supply unit 7 to be described later supplies the imprint material 6 to the upper surface (processed surface) of the substrate 4.

The mold stage 2 holds the mold 1 by, for example, a vacuum suction force or an electrostatic force, and drives the mold 1 in a Z direction to bring the pattern region 1*a* of the mold 1 and the imprint material 6 on the substrate into contact with each other or separate them from each other. In addition to a function of driving the mold 1 in the Z direction, the mold stage 2 may have an adjustment function of adjusting the position of the mold 1 in X and Y directions and a θ direction (a rotation direction about a Z-axis), a tilt function of correcting the tilt of the mold 1, and the like. The substrate stage 5 holds the substrate 4 by, for example, a vacuum suction force or an electrostatic force, and positions the substrate 4 in the X and Y directions. In addition to a function of moving the substrate 4 in the X and Y directions, the substrate stage 5 may have a function of moving the substrate 4 in the Z direction, an adjustment function of adjusting the position of the substrate 4 in the θ direction, and the like. In the imprint apparatus 100 according to the first embodiment, the mold stage 2 performs an operation of changing the distance between the mold 1 and the substrate 4. However, the present invention is not limited to this, and the substrate stage 5 may perform that operation or both of the mold stage 2 and the substrate stage 5 may relatively perform that operation.

The curing unit 3 cures the imprint material 6 supplied on the substrate by irradiating it with light (ultraviolet rays) in the imprint process. The curing unit 3 includes, for example, a light source which emits light (ultraviolet rays) which cures the imprint material 6. The curing unit 3 may also include an optical element for adjusting the light emitted from the light source to light suitable for the imprint process. Since the first embodiment adopts the photo-curing method, the light source which emits ultraviolet rays is used. However, when the first embodiment adopts, for example, a thermosetting method, a heat source for setting a thermosetting resin serving as the imprint material 6 can be used instead of the light source.

The supply unit 7 can include a tank 7*a* which contains the imprint material 6 and a dispenser 7*b* which supplies the imprint material 6 contained in the tank 7*a* to the substrate. The dispenser 7*b* includes a plurality of nozzles 7*c* (orifices) which discharge the droplets of the imprint material 6 toward the substrate 4. The supply unit 7 supplies the imprint material 6 on the substrate by discharging the droplets of the imprint material 6 from each nozzle 7*c* in a state in which the substrate 4 and the supply unit 7 move relatively. When, for example, the plurality of nozzles 7*c* are arrayed in the Y direction, a step of supplying the droplets of the imprint material 6 from each nozzle 7*c* to the substrate 4 is performed in a state in which the substrate 4 moves in a direction (for example, the X direction) different from the arrayed direction of the plurality of nozzles 7*c*. At this time, the control unit 8 controls discharge or non-discharge (discharge timing) of the droplet from each nozzle 7*c* in accordance with a map (arrangement information) showing the arrangement of the droplets of the imprint material 6 which should be supplied on the substrate. The control unit 8 generates the map in advance based on the design information of the concave-convex pattern that has been formed in the pattern region 1*a* of the mold 1 and the ideal volume of each droplet discharged from each nozzle 7*c*. The ideal volume of each droplet discharged from each nozzle 7*c* indicates the volume of each droplet that should be discharged from each nozzle 7*c* in a state in which no abnormality such as a manufacturing error or clogging occurs in each nozzle 7*c*.

[Method of Generating Map]

Figure 2:
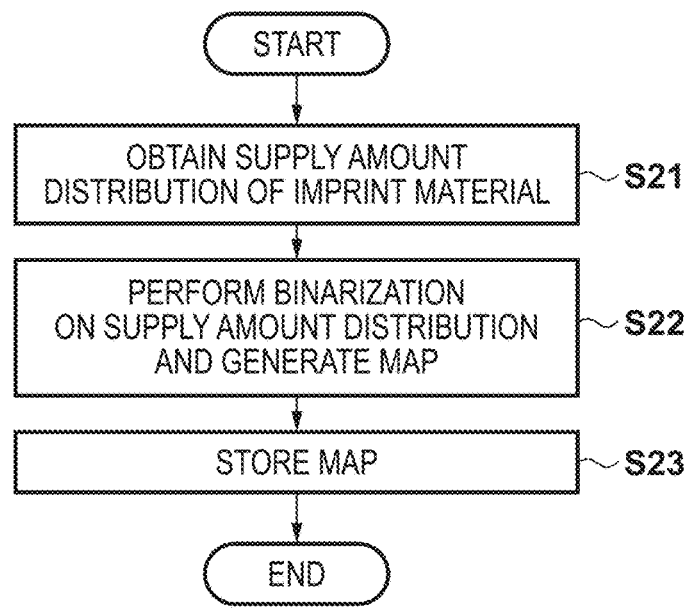
FIG. 2 is a flowchart showing a method of generating a map.
Figure 3:
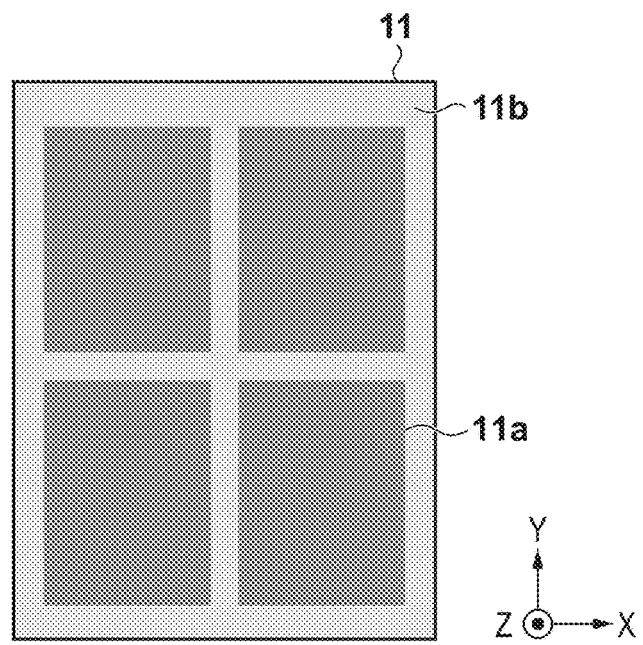
FIG. 3 is a view showing an example of a supply amount distribution.

A method of generating the map by the control unit 8 will now be described. FIG. 2 is a flowchart showing the method of generating the map for controlling discharge of the droplets of the imprint material 6 from each nozzle 7*c*. In step S21, the control unit 8 obtains, based on the design information of the pattern (information showing the position of the pattern and the depth of a concave portion), a supply amount distribution 11 of the imprint material 6 necessary for the concave-convex pattern that has been formed on the mold 1. For example, the control unit 8 obtains, using the ideal volume of each droplet discharged from each nozzle 7*c*, the supply amount distribution 11 such that the thickness of the imprint material 6 formed into the concave-convex pattern using the mold 1 falls within an allowable range. Note that the thickness of the imprint material 6 indicates, for example, the thickness of the imprint material 6 between the substrate 4 and each concave portion of the concave-convex pattern formed by the imprint material 6. This thickness is generally referred to as a residual layer thickness (RLT). Instead of the residual layer thickness, the height of the pattern of the imprint material 6 formed on the substrate may be used. FIG. 3 is a view showing an example of the supply amount distribution 11 obtained based on the design information of the pattern that has been formed on the mold 1. In FIG. 3, the supply amount distribution 11 is represented with multi-value image data by color densities and a darker color indicates the larger supply amount of the imprint material 6. In the supply amount distribution 11 shown in FIG. 3, for example, each region 11*a* is a region corresponding to the pattern region 1*a* on the mold to which a larger amount of the imprint material 6 is supplied than in each region 11*b*.

Figure 4:
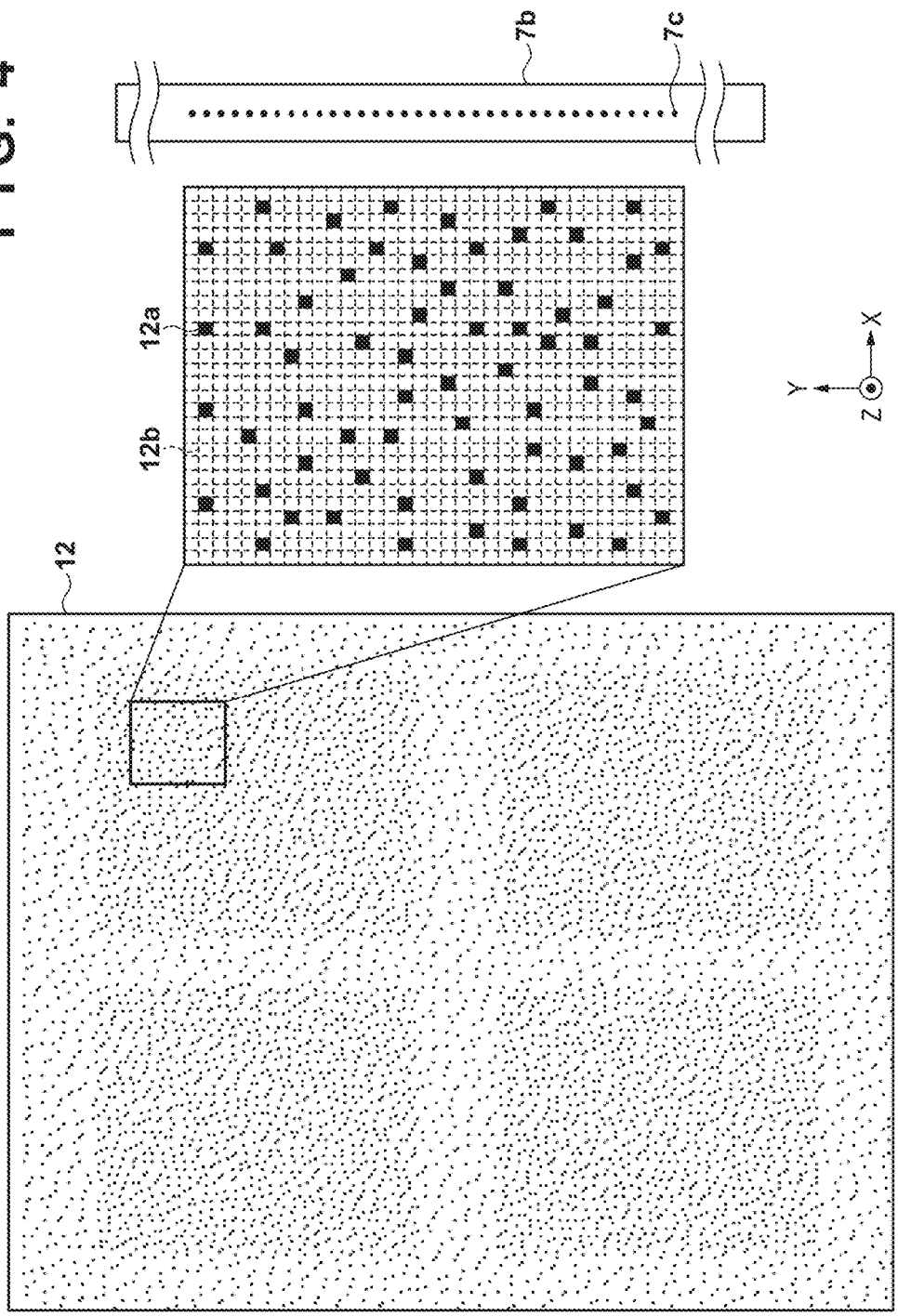
FIG. 4 is a view showing a map generated based on the supply amount distribution.

In step S22, the control unit 8 performs binarization by halftone processing on the supply amount distribution 11 obtained in step S21 and generates a map showing a position on the substrate on which the droplets of the imprint material 6 are supplied. For example, an error diffusion method can be used as the halftone processing. FIG. 4 is a view showing a map 12 generated based on the supply amount distribution 11 and also showing the array of the plurality of nozzles 7*c* in the dispenser 7*b*. The map 12 can be generated such that a plurality of pixels in the Y direction and the plurality of nozzles 7*c* in the dispenser 7*b* have the same number. Note that the map 12 generated in step S22 shows the arrangement of the droplets of the imprint material 6 that should be supplied to one shot region on the substrate. The shot region is a region on the substrate where the pattern of the mold 1 is to be transferred by one imprint process. Further, in the map 12 shown in FIG. 4, each black pixel 12*a* indicates a position on the shot region where the droplets of the imprint material 6 are to be supplied and each white pixel 12*b* indicates a position on the shot region where the droplets of the imprint material 6 are not to be supplied. In step S23, the control unit 8 stores the map generated in step S22.

In accordance with the map generated as described above, the control unit 8 controls discharge of the droplets from each nozzle 7c while relatively moving the substrate 4 and the supply unit 7 in the X direction. In the imprint apparatus 100, however, the volume of each droplet actually discharged from each nozzle 7c may be different from the ideal volume owing to a manufacturing variation in the nozzle or the like. In this case, if discharge of each nozzle 7c is controlled using the map generated by the above-described method, the total amount of the imprint material 6 actually supplied on the substrate by the supply unit 7 may be different from the total amount of the imprint material 6 necessary for the thickness of the imprint material 6 to be a target thickness. As a result, it may become difficult to bring the thickness of the imprint material 6 formed using the mold 1 closer to the target thickness. Therefore, the imprint apparatus 100 according to this embodiment obtains information on the total amount of the imprint material 6 that has actually been supplied on the substrate in accordance with the map. Then, the imprint apparatus 100 updates the map to bring the product of the ideal volume of each droplet (imprint material) discharged from each nozzle 7c in one-time discharge and the number (number of discharges) of droplets supplied on the substrate from the supply unit 7 closer to the total amount of the imprint material 6 in the information. The imprint process in the imprint apparatus 100 according to the first embodiment will be described below.

[Imprint Process]

Figure 5:
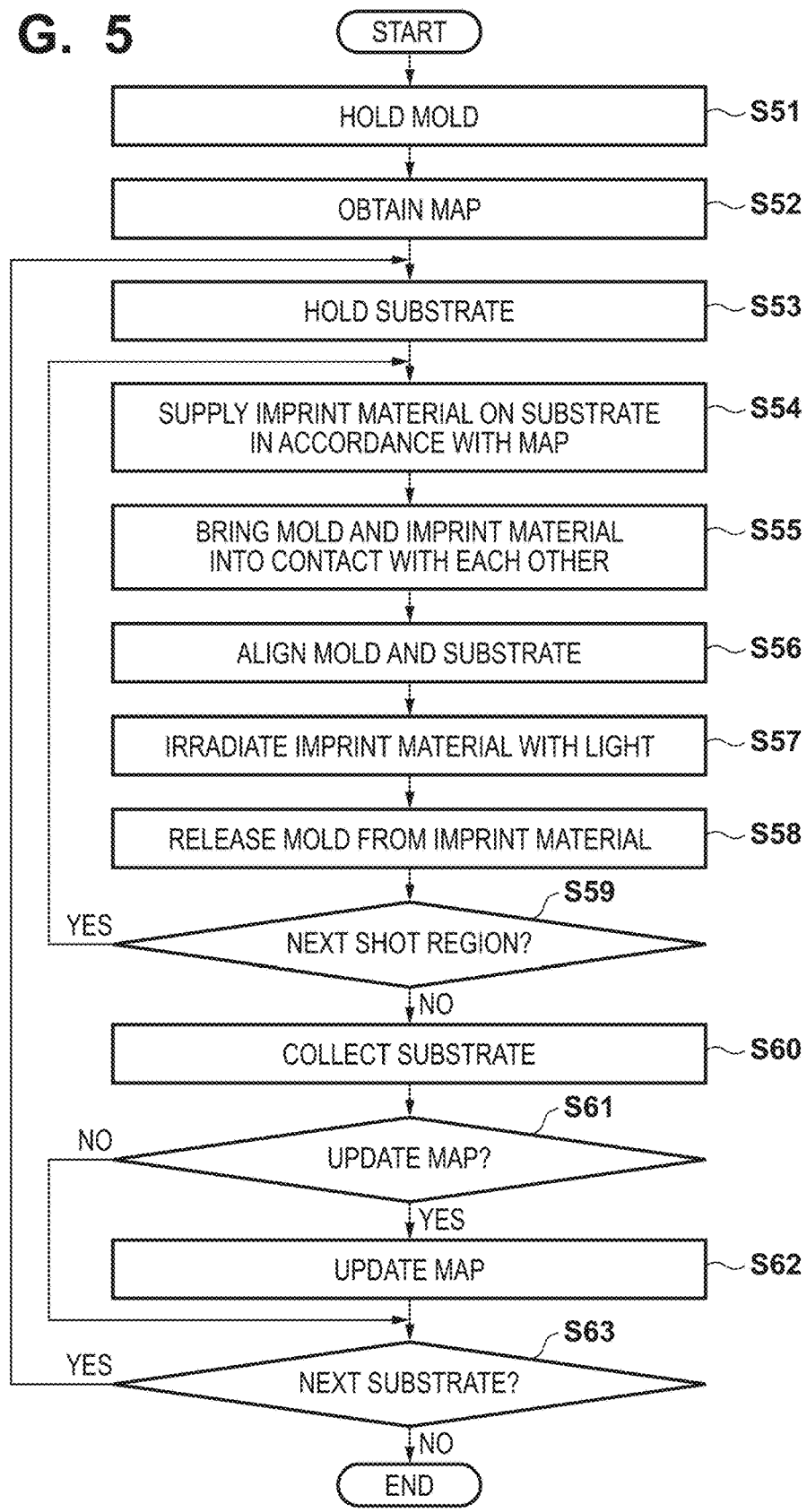
FIG. 5 is a flowchart showing an imprint process according to the first embodiment.

FIG. 5 is a flowchart showing the imprint process according to the first embodiment. In step S51, the control unit 8 controls a mold conveyance mechanism (not shown) to convey the mold 1 to a position below the mold stage 2 and controls the mold stage 2 to hold the mold 1. A concave-convex pattern according to the design information is formed on the mold 1 (pattern region 1a), as described above, and an individual ID for identifying the pattern formed on the mold 1 is set. The control unit 8 causes a reading mechanism (not shown) to read the individual ID of the mold 1, thereby obtaining the individual ID. In step S52, the control unit 8 obtains, based on the individual ID of the mold 1 obtained in step S51, a map for controlling each of the plurality of nozzles 7c of the dispenser 7b. The map may be generated in advance based on the design information of the concave-convex pattern formed on the mold 1 or may sequentially be generated by reading out the design information of the pattern from the individual ID. In step S53, the control unit 8 controls a substrate conveyance mechanism (not shown) to convey the substrate 4 to a position above the substrate stage 5 and controls the substrate stage 5 to hold the substrate 4. The substrate 4 is thus arranged within the imprint apparatus.

In step S54, the control unit 8 controls the supply unit 7 to supply the imprint material 6 to a target shot region to which the pattern of the mold 1 is to be transferred. For example, the control unit 8 controls discharge of droplets from each nozzle 7c according to the map obtained in step S53 while moving the substrate 4 in the X direction. In step S55, the control unit 8 controls the substrate stage 5 to arrange, below the pattern region 1a of the mold 1, the shot region to which the imprint material 6 has been supplied. The control unit 8 controls the mold stage 2 to decrease the distance between the mold 1 and the substrate 4, thereby bringing the mold 1 and the imprint material 6 on the substrate into contact with each other. In step S56, the control unit 8 aligns the mold 1 and the substrate 4 in the state in which the mold 1 and the imprint material 6 are in contact with each other. For example, the control unit 8 causes an alignment scope (not shown) to detect a mark provided on the mold 1 and a mark provided on the substrate 4, and controls the relative positions of the mold 1 and the substrate 4 using the detected marks of the mold 1 and the substrate 4. Note that in steps S55 and S56, a predetermined time may elapse in the state in which the mold 1 and the imprint material 6 are in contact with each other in order to sufficiently fill the concave portions of the pattern of the mold 1 with the imprint material 6 on the substrate.

In step S57, the control unit 8 controls the curing unit 3 to irradiate, with light (ultraviolet rays), the imprint material 6 which is in contact with the mold 1, thereby curing the imprint material 6. In step S58, the control unit 8 controls the mold stage 2 to to increase the distance between the mold 1 and the substrate 4, thereby separating (releasing) the mold 1 from the imprint material 6. In step S59, the control unit 8 determines whether there is a shot region (next shot region) to which the pattern of the mold 1 is to be continuously transferred onto the substrate. If there is the next shot region, the process advances to step S54. If there is no next shot region, the process advances to step S60. In step S60, the control unit 8 controls the substrate conveyance mechanism (not shown) to collect the substrate 4 from the substrate stage 5. In step S61, the control unit 8 determines whether to update the map. If the control unit 8 determines to update the map, the process advances to step S62. If the control unit 8 determines not to update the map, the process advances to step S63. The control unit 8 may determine whether to update the map in consideration of, for example, the number of substrates 4 or shot regions to which the pattern of the mold 1 has been transferred, an elapsed time since the last map update, or replacement time of the dispenser 7b. In particular, the control unit 8 may determine to update the map when replacing the dispenser 7b. The control unit 8 may also determine to update the map if the difference between the target thickness and the thickness of the imprint material 6 actually formed using the mold 1 is equal to or larger than a threshold. In step S62, the control unit 8 updates the map based on the information on the total amount of the imprint material 6 that has actually been supplied on the substrate in accordance with the map, as will be described later. The control unit 8 updates the map by, for example, changing the number of droplets in the map. In step S63, the control unit 8 determines whether there is the substrate 4 (next substrate 4) where transfer of the pattern of the mold 1 is to be performed continuously. If there is the next substrate 4, the process advances to step S53. If there is no next substrate, the imprint process ends.

[Map Update]

Map update performed in step S62 will now be described. FIG. 6 is a flowchart of the map update. In step S62-*a*1, the control unit 8 obtains information on the volume of the imprint material 6 that has actually been supplied on the substrate in accordance with the map. The information can be obtained using, for example, the imprint material 6 supplied on the substrate in accordance with the map and after being formed using the mold 1. The total amount (volume V) of the imprint material 6 formed using the mold 1 is given by, for example:

$$A = Sp \times D + Sa \times RLT \qquad (1)$$

where Sp represents an area of the concave portion in the concave-convex pattern of the mold 1 in the X and Y directions, D represents a depth of the concave portion in the concave-convex pattern of the mold 1, Sa represents an area of the pattern region 1a on the mold, and RLT represents a thickness (residual layer thickness) of the imprint material 6. That is, the control unit 8 can obtain the information based on the thickness of the imprint material 6 and the design information of the concave-convex pattern of the mold 1. The thickness of the imprint material 6 can be measured by, for example, a measurement unit 40 provided within the imprint apparatus 100 or a measurement apparatus provided outside the imprint apparatus 100. FIG. 7 is a view showing a thickness distribution 13 (residual layer thickness distribution) of the imprint material 6 measured in each of a plurality of portions on the substrate (on the shot region). In FIG. 7, the thickness of the imprint material 6 in each portion is represented with multi-value image data by color densities. For example, each portion 13a in FIG. 7 indicates a portion where the thickness of the imprint material 6 is smaller than in a portion 13b.

In step S62-a2, the control unit determines a correction coefficient α for correcting the number of droplets in the map. The relationship among an ideal volume Vd of each droplet discharged from each nozzle 7c, the number N of droplets in the map, and a volume A of the imprint material 6 in the obtained information can be given, for example, using the correction coefficient α, by:

$$Vd \times N \times \alpha = Sp \times D + Sa \times RLT \quad (2)$$

Therefore, the control unit 8 determines the correction coefficient α to satisfy equation (2). That is, the control unit 8 determines the correction coefficient α by excluding the ideal volume of each droplet from each nozzle 7c and the number of droplets in the map from the total amount of the imprint material in the information obtained in step S62-a1. If the difference between the ideal volume and the volume of each droplet actually discharged from each nozzle 7c occurs, a value obtained by multiplying the number N of droplets in the map by the thus determined correction coefficient α will be the number (necessary number N') of droplets needed in the map. As shown in FIG. 7, if the thickness of the imprint material 6 formed using the mold 1 changes in the respective portions, the correction coefficient α may be obtained in each portion. In this case, the number of droplets in the map is changed in each portion.

In step S62-a3, the control unit 8 newly generates a map showing the arrangement of the droplets to be supplied on the substrate using the correction coefficient α determined in step S62-a2. The control unit 8 generates a distribution (correction distribution 14) where the amount of the imprint material 6 supplied on the substrate by the supply unit 7 is corrected by multiplying the supply amount distribution 11 obtained based on the design information of the concave-convex pattern of the mold 1 by the correction coefficient α. FIG. 8 is a view showing an example of the correction distribution 14 and is represented with multi-value image data by color densities. In the correction distribution 14 shown in FIG. 8, each region 14a is a region corresponding to the pattern region 1a on the mold to which a larger amount of the imprint material 6 is supplied than in a region 14b. In the example of the correction distribution 14 shown in FIG. 8, the color is darker overall than in the supply amount distribution 11 shown in FIG. 3 and the supply amount of the imprint material 6 is increased overall.

Figure 9:
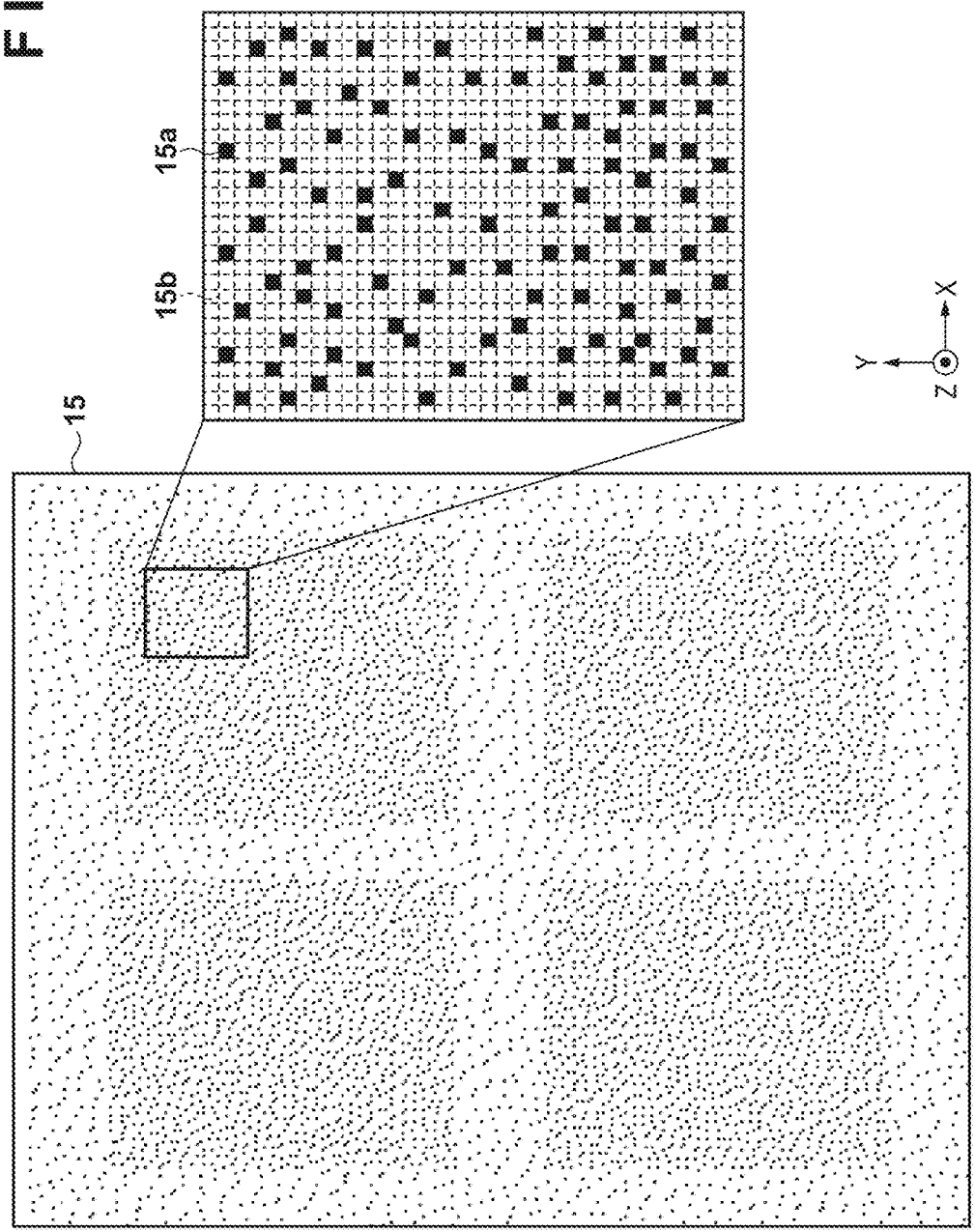
FIG. 9 is a view showing a newly generated map.

The control unit 8 can newly generate a map such that the number of droplets supplied on the substrate from the supply unit 7 becomes the necessary number N' by performing binarization by halftone processing on the correction distribution 14 shown in FIG. 8. That is, the control unit 8 can generate the map to bring the product of the ideal volume of each droplet discharged from each nozzle 7c and the number of droplets supplied on the substrate by the supply unit 7 closer to the total amount of the imprint material 6 in the information obtained in step S62-a1. FIG. 9 is a view showing a newly generated map 15. In the map 15 shown in FIG. 9, each black pixel 15a indicates a position on the shot region where the droplets of the imprint material 6 are to be supplied and each white pixel 15b indicates a position on the shot region where the droplets of the imprint material 6 are not to be supplied. In the new map 15 shown in FIG. 9, it is found that the number of droplets is changed from that in the map 12 shown in FIG. 4. In step S62-a4, the control unit 8 stores the map newly generated in step S62-a3 and updates the map.

The correction coefficient α determined in the above-described step can also be used when generating a map (fourth map) different from the map used to determine the correction coefficient α. In this case, the control unit 8 generates the fourth map such that the number of droplets in the fourth map becomes the number obtained by multiplying the number of droplets obtained based on the ideal volume of the droplet discharged from each nozzle 7c and the design information of the concave-convex pattern of the mold by the correction coefficient α. By generating the fourth map as described above, it is possible to bring the thickness of of the imprint material 6 supplied on the substrate in accordance with the fourth map and formed using the mold closer to the target thickness.

As described above, the imprint apparatus 100 according to the first embodiment determines the correction coefficient α for correcting the number of droplets in the map. Then, the imprint apparatus 100 updates the map, using the determined correction coefficient α, to bring the product of the ideal volume of each droplet discharged from each nozzle 7c and the number of droplets supplied on the substrate from the supply unit 7 closer to the total amount of the imprint material 6 in the information. This allows the imprint apparatus 100 to bring the thickness of the imprint material formed using the mold 1 closer to the target thickness even if the volume of the droplet actually discharged from each nozzle 7c is different from the ideal volume.

Second Embodiment

An imprint apparatus according to the second embodiment of the present invention will be described. In the first embodiment, the example has been described, in which the correction coefficient α is obtained based on the information on the total amount of the imprint material 6 actually supplied on the substrate in accordance with one map. In order to obtain this correction coefficient α more accurately, a plurality of pieces of information obtained on a plurality of conditions different from each other may be used. The plurality of pieces of information can be obtained by, for example, obtaining the total amount of the imprint material supplied on the substrate in accordance with each of a plurality of maps. In the second embodiment, an example will be described, in which a correction coefficient α1 is obtained based on a plurality of pieces of information obtained by obtaining the total amount (volume) an imprint material supplied on a substrate in accordance with each of a plurality of maps and formed using a mold corresponding to each map. In the following description, map update in an imprint apparatus according to the second embodiment will be described. The imprint apparatus according to the second embodiment has the same apparatus configuration as the imprint apparatus 100 according to the first embodiment, and thus a description thereof will be omitted.

[Map Update]

Figure 10:
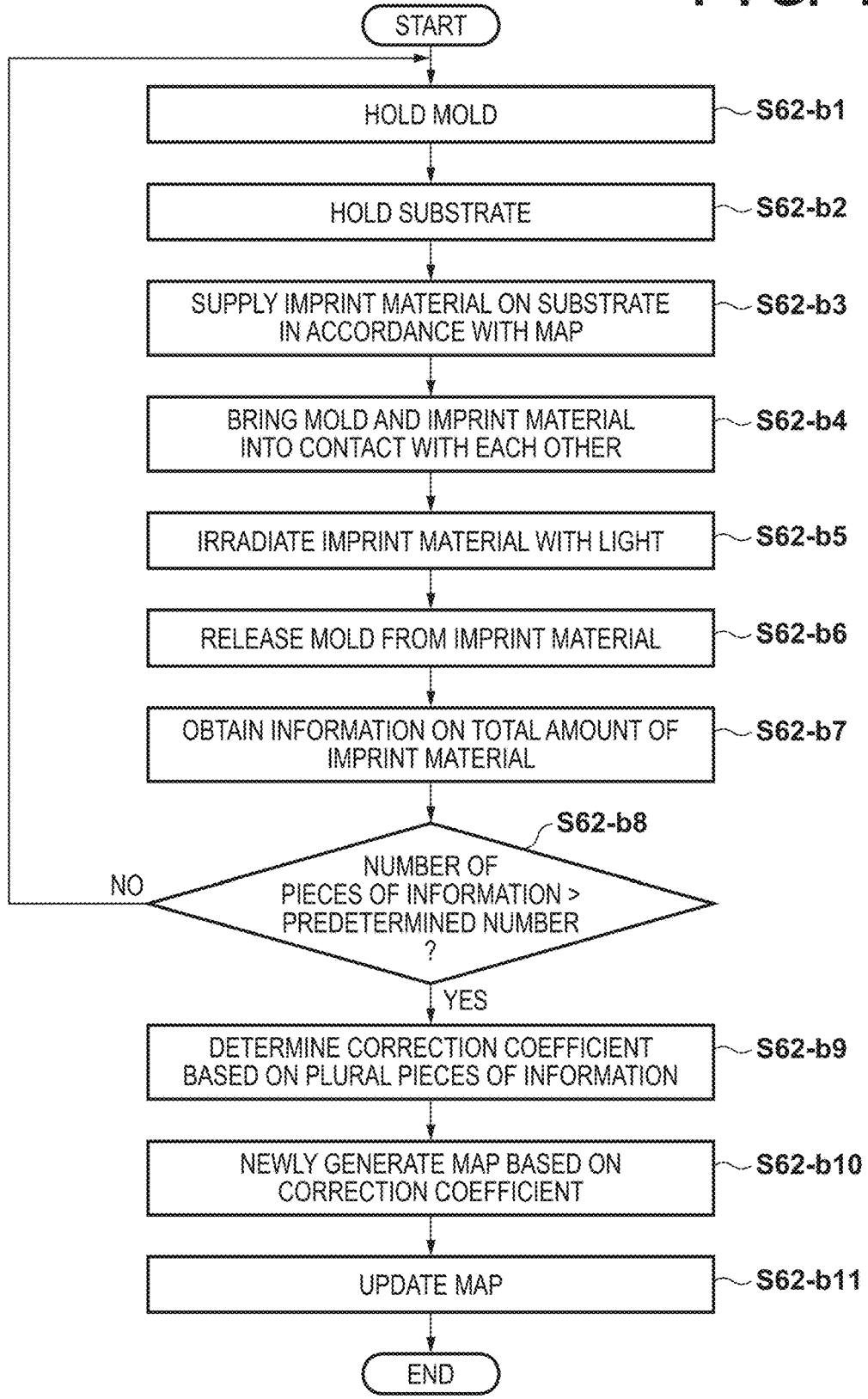
FIG. 10 is a flowchart of map update according to the second embodiment.

The map update (step S62) performed in the imprint apparatus according to the second embodiment will be described. FIG. 10 is a flowchart of the map update according to the second embodiment.

In step S62-b1, a control unit 8 controls a mold stage 2 to hold a map to be used for the map update. In step S62-b2, the control unit 8 controls a substrate stage to hold the substrate (for example, a dummy substrate). In step S62-b3, the control unit 8 controls a supply unit 7 to supply, in accordance with the map, the imprint material to a region on the substrate to which the pattern of the mold is transferred. The map generated by executing the flowchart of FIG. 2 may be used for the mold held by the mold stage 2 in step S62-b1. In step S62-b4, the control unit 8 arranges a region on the substrate on which the imprint material is supplied below the pattern region of the mold, thereby bringing the mold and the imprint material on the substrate into contact with each other. In step S62-b5, the control unit 8 controls a curing unit 3 to irradiate, with light (ultraviolet rays), the imprint material which is in contact with the mold, thereby curing the imprint material.

In step S62-b6, the control unit 8 separates (releases) the mold from the cured imprint material 6. In step S62-b7, the control unit 8 causes a measurement unit 40 to measure the thickness of the imprint material formed into a concave-convex pattern and obtains information on the total amount of the imprint material actually supplied on the substrate by the supply unit 7. The measurement unit 40 in the imprint apparatus measures the thickness of the imprint material here. However, a measurement apparatus or the like provided outside the imprint apparatus may measure the thickness. In step S62-b8, the control unit 8 determines whether the number of pieces of information on the total amount of the imprint material has reached a predetermined number. If the number of pieces of information has reached the predetermined number, the process advances to step S62-b9. On the other hand, if the number of pieces of information has not reached the predetermined number, the process advances to step S62-b1 to start obtaining information using a mold different from the mold that has been used to obtain the information.

In step S62-b9, the control unit 8 determines the correction coefficient α1 based on the plurality of pieces of information obtained by repeating steps S62-b1 to S62-b7. Assume a case in which, for example, the correction coefficient α1 is obtained using a plurality of molds including a first mold 1' and a second mold 1". FIG. 11 is a view showing the first mold 1' and the second mold 1". As shown in FIG. 11, the first mold 1' and the second mold 1" are formed such that the depths of concave portions in the concave-convex patterns are different from each other. In this case, the control unit 8 can obtain, in step S62-b7, the first supply information based on the thickness of the imprint material supplied on the substrate in accordance with the first map (first arrangement information) and formed using the first mold 1'. The first map may be generated by executing the flowchart of FIG. 2 for the first mold 1'. At this time, the relationship among an ideal volume Vd of a droplet discharged from each nozzle 7c, the number N1 of droplets in the first map, and the total amount of the imprint material in the first supply information can be given, using the correction coefficient α1, by:

$$Vd \times N1 \times \alpha1 = Sp \times D1 + Sa \times RLT1 \quad (3)$$

where Sp represents an area of the concave portion in the pattern formed on the mold (the first mold 1' or the second mold 1") in the X and Y directions, D1 represents a depth of the concave portion in the pattern formed on the first mold, Sa represents an area of a pattern region on the mold, and RLT1 represents a thickness (residual layer thickness) of an imprint material 6 formed using the first mold 1'. The right-hand side of equation (3) represents the total amount of the imprint material in the first supply information, and is calculated based on the design information of the pattern of the first mold 1' and the thickness of the imprint material formed using the first mold 1'.

The control unit 8 can also obtain, in step S62-b7, the second supply information based on the thickness of the imprint material supplied on the substrate in accordance with the second map (second arrangement information) and formed using the second mold 1". The second map may be generated by executing the flowchart of FIG. 2 for the second mold 1". At this time, the relationship among the ideal volume of the droplet discharged from each nozzle, the number of droplets in the second map, and the total amount of the imprint material in the second supply information can be given, using the correction coefficient α1, by:

$$Vd \times N2 \times \alpha1 = Sp \times D2 + Sa \times RLT2 \quad (4)$$

where N2 represents the number of droplets in the second map, D2 represents a depth of the concave portion in the concave-convex pattern formed on the second mold 1", and RLT2 represents a thickness (residual layer thickness) of the imprint material 6 formed using the second mold 1". The right-hand side of equation (4) represents the volume of the imprint material in the second supply information, and is calculated based on the design information of the pattern of the second mold 1" and the thickness of the imprint material formed using the second mold 1". Then, the control unit 8 can determine the correction coefficient α1 using equations (3) and (4).

In step S62-b10, the control unit 8 newly generates, using the correction coefficient α1 determined in step S62-b9, a map showing the arrangement of the droplet of the imprint material supplied on the substrate. Step S62-b10 is the same as the above-described step S62-a3, and thus a description thereof will be omitted. In step S62-b11, the control unit 8 stores the map newly generated in step S62-b10 and updates the map.

As described above, the imprint apparatus according to the second embodiment obtains the correction coefficient α1 using the plurality of pieces of information obtained by obtaining the total amount of the imprint material supplied on the substrate in accordance with each of the plurality of maps. Then, the imprint apparatus according to the second embodiment updates the map by generating a new map using the correction coefficient α1. By obtaining the correction coefficient α1 using the plurality of pieces of information and updating the map as described above, it is possible to bring the thickness of the imprint material formed using a mold 1 much closer to a target thickness. In the second embodiment, the example in which the map update is performed using two molds (the first mold 1' and the second mold 1") has been described. However, the number of molds is not limited to two but may be three or more. Further, the plurality of molds used for the map update may include the mold 1 used in steps S51 to S60 in the flowchart of FIG. 5. In this case, information on the total amount of the imprint material 6 formed using the mold 1 can be used as one of the plurality of pieces of information.

Third Embodiment

The imprint apparatus according to the third embodiment of the present invention will be described. In the third embodiment, an example will be described, in which a correction coefficient α2 is obtained based on a plurality of pieces of information obtained by obtaining the volume of an imprint material supplied on a substrate in accordance with each of a plurality of maps. In the second embodiment, the plurality of pieces of information are obtained using the plurality of molds. In the third embodiment, however, the plurality of pieces of information are obtained using one mold (third mold). Map update according to the third embodiment will be described below. The map update according to the third embodiment is performed in accordance with a flowchart shown in FIG. 10, but is different from the map update according to the second embodiment in step S62-b9.

In step S62-b9, a control unit 8 obtains the correction coefficient α2 based on the plurality of pieces of information obtained by repeating steps S62-b1 to S62-b7. Assume a case in which, for example, the correction coefficient α2 is obtained using a plurality of maps including the first map and the second map for one mold (third mold). Note that the first map and the second map have the different number of droplets. In this case, the control unit 8 can obtain, in step S62-b7, the first supply information based on the thickness of the imprint material supplied on the substrate in accordance with the first map and formed using the third mold. At this time, the relationship among an ideal volume Vd of a droplet discharged from each nozzle 7c, the number N1 of droplets in the first map, and the total amount of the imprint material in the first supply information can be given, using the correction coefficient α2, by:

$$Vd \times N1 \times \alpha2 = Sp \times D + Sa \times RLT1 \quad (5)$$

where Sp represents an area of the concave portion in a pattern formed on the third mold in the X and Y directions, D represents a depth of the concave portion in the pattern formed on the third mold, Sa represents an area of a pattern region on the mold, and RLT1 represents a thickness (residual layer thickness) of an imprint material 6 when using the first map. The right-hand side of equation (5) represents the total amount of the imprint material in the first supply information, and is calculated based on the design information of the pattern of the third mold and the thickness of the imprint material when using the first map.

The control unit 8 can also obtain, in step S62-b7, the second supply information based on the thickness of the imprint material supplied on the substrate in accordance with the second map and formed using the third mold. At this time, the relationship among the ideal volume Vd of each droplet discharged from each nozzle 7c, the number N2 of droplets in the second map, and the total amount of the imprint material in the second supply information can be given, using the correction coefficient α2, by:

$$Vd \times N2 \times \alpha2 = Sp \times D + Sa \times RLT2 \quad (6)$$

where RLT2 represents a thickness of the imprint material when using the second map. The right-hand side of equation (6) represents the total amount of the imprint material in the second supply information, and is calculated based on the design information of the pattern of the third mold and the thickness of the imprint material when using the second map. Then, the control unit 8 can determine the correction coefficient α2 using equations (5) and (6).

As described above, the imprint apparatus according to the third embodiment obtains the correction coefficient α2 using the plurality of pieces of information obtained by obtaining the total amount of the imprint material supplied on the substrate in accordance with each of the plurality of maps. Then, the imprint apparatus according to the third embodiment updates the map by generating a new map using the correction coefficient α2. By obtaining the correction coefficient α2 using the plurality of pieces of information and updating the map as described above, it is possible, as in the second embodiment, to bring the thickness of the imprint material 6 formed using a mold 1 much closer to a target thickness. The third mold used to obtain the correction coefficient α2 may be the mold 1 used in steps S51 to S60 in the flowchart of FIG. 5. Further, the plurality of maps used for the map update may be the maps used in steps S51 to S60 in the flowchart of FIG. 5.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a resin applied to a substrate using the above-described imprint apparatus (a step of performing an imprint process on the substrate), and a step of processing the substrate onto which the pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-119892 filed Jun. 10, 2014, which is hereby incorporated by reference herein in its entirety.

What is claimed is:

1. An imprint apparatus which forms a pattern of an imprint material on a substrate using a mold, the apparatus comprising:

a supply unit including a plurality of orifices, each of the plurality of orifices discharges the imprint material toward the substrate, and configured to supply the imprint material on the substrate by discharging the imprint material from each of the plurality of orifices; and a control unit configured to control the discharge of the imprint material from each of the plurality of orifices in accordance with arrangement information showing an arrangement, on the substrate, of the imprint material to be discharged from each of the plurality of orifices, wherein the control unit obtains a measurement result on a thickness of a pattern of the imprint material that has been actually supplied on the substrate in accordance with the arrangement information and formed using the mold, and updates the arrangement information by correcting the number of discharges of the imprint material in the arrangement information, based on the obtained measurement result.

2. The apparatus according to claim 1, wherein the control unit determines a coefficient for correcting the number of discharges of the imprint material in the arrangement information such that a difference between the measured thickness of the pattern of the imprint material formed on the substrate and a target thickness is reduced, and updates the arrangement information using the coefficient.

3. The apparatus according to claim 2, wherein the control unit updates the arrangement information by dividing the number of discharges of the imprint material in the arrangement information by the coefficient.

4. The apparatus according to claim 2, wherein the control unit determines the coefficient using a plurality of measurement results,
the plurality of measurement results include a first measurement result on a thickness of a pattern of the imprint material that has been actually supplied on the substrate in accordance with first arrangement information and formed, and a second measurement result on a thickness of a pattern of the imprint material that has been actually supplied on the substrate in accordance with second arrangement information and formed, and
the number of discharges of the imprint material is different in the first arrangement information and the second arrangement information.

5. The apparatus according to claim 4, wherein the first measurement result is obtained from the pattern of the imprint material that has been supplied on the substrate in accordance with the first arrangement information and formed using a first mold, and the second measurement result is obtained from the pattern of the imprint material that has been supplied on the substrate in accordance with the second arrangement information and formed using a second mold, and
the first mold and the second mold include concave-convex patterns, respectively, and depths of concave portions in the concave-convex patterns are different in the first mold and the second mold.

6. The apparatus according to claim 4, wherein the first measurement result is obtained from the pattern of the imprint material that has been supplied on the substrate in accordance with the first arrangement information and formed using a third mold, and the second measurement result is obtained from the pattern of the imprint material that has been supplied on the substrate in accordance with the second arrangement information and formed using the third mold.

7. The apparatus according to claim 2, wherein the control unit generates fourth arrangement information to be used for a fourth mold, the fourth arrangement information being different from the arrangement information used to determine the coefficient, by correcting the number of discharges of the imprint material obtained based on design information of the pattern of the fourth mold by the coefficient.

8. The apparatus according to claim 1, wherein the control unit obtains the measurement result based on design information of the pattern of the mold and a measurement value of a thickness of the pattern of the imprint material that has been actually supplied on the substrate in accordance with the arrangement information and formed using the mold.

9. The apparatus according to claim 1, wherein the arrangement information is generated based on an ideal volume of the imprint material to be discharged from each of the plurality of orifices in one-time discharge and design information of the pattern of the mold.

10. The apparatus according to claim 1, further comprising a measurement unit configured to measure a thickness of a pattern of the imprint material that has been supplied on the substrate and formed using the mold.

11. An imprint apparatus which forms a pattern of an imprint material on a substrate using a mold, the apparatus comprising:
a supply unit including a plurality of orifices, each of the plurality of orifices discharges the imprint material toward the substrate, and configured to supply the imprint material on the substrate by discharging the imprint material from each of the plurality of orifices; and
a control unit configured to control the discharge of the imprint material from each of the plurality of orifices in accordance with arrangement information showing an arrangement, on the substrate, of the imprint material to be discharged from each of the plurality of orifices,
wherein the control unit
determines a coefficient for correcting the number of discharges of the imprint material in first arrangement information, based on a measurement result on a thickness of a pattern of the imprint material that has been actually supplied on the substrate in accordance with the first arrangement information and formed using a first mold, and
generates second arrangement information to be used for a second mold, the second arrangement information different from the first arrangement information used to determine the coefficient, by correcting the number of discharges of the imprint material obtained based on design information of the pattern of the second mold by the coefficient.

12. The apparatus according to claim 1, wherein the control unit updates the arrangement information in a case where a difference between the measured thickness of the pattern of the imprint material formed on the substrate and a target thickness is equal to or larger than a threshold.

13. The apparatus according to claim 1, wherein the control unit updates the arrangement information such that the number of discharges of the imprint material is changed overall in the arrangement information.

14. The apparatus according to claim 1, wherein the control unit updates, based on the measurement result, the arrangement information for each of a plurality of portions where the thicknesses of the pattern of the imprint material are different from each other on the substrate.

15. The apparatus according to claim 2, wherein the control unit determines, based on the measurement result, the coefficient for each of a plurality of portions where the thicknesses of the pattern of the imprint material are different from each other on the substrate.

16. The apparatus according to claim 2, wherein the control unit generates an arrangement information to be used for another mold different from the mold used to determine the coefficient, by correcting, by the coefficient, the number of discharges of the imprint material obtained based on design information of a pattern of the another mold.

17. An imprint apparatus which forms a pattern of an imprint material on a substrate using a mold, the apparatus comprising:
a supply unit including a plurality of orifices, each of the plurality of orifices discharges the imprint material toward the substrate, and configured to supply the imprint material on the substrate by discharging the imprint material from each of the plurality of orifices; and
a control unit configured to control the discharge of the imprint material from each of the plurality of orifices in accordance with arrangement information showing an arrangement, on the substrate, of the imprint material to be discharged from each of the plurality of orifices, wherein the control unit determines a coefficient for correcting the number of discharges of the imprint material in first arrangement information generated for a first mold, based on a total amount of the imprint material that has been actually supplied on the substrate in accordance with the first arrangement information, and a product of an ideal volume of the imprint material to be discharged from each of the plurality of orifices in one time discharge and the number of discharges of the imprint material in the first arrangement information, and generates second arrangement information to be used for a second mold different from the first mold, by correcting the number of the discharges of the imprint material determined based on the ideal volume and design information of a pattern of the second mold by the coefficient.

18. An apparatus which forms a film by curing an uncured material in a state of bringing a member and an uncured material on a substrate into contact with each other and by seperating the cured material and the member from each other, the apparatus comprising:

a supply unit including a plurality of discharge ports, each of the plurality of discharge ports discharges the uncured material toward the substrate, and configured to supply the uncured material on the substrate by discharging the uncured material from each of the plurality of discharge ports;

a curing unit configured to cure the uncured material in a state in which the member is brought into contact with the uncured material; and a control unit configured to control the discharge of the uncured material from each of the plurality of discharge ports in accordance with arrangement information showing an arrangement, on the substrate, of the uncured material to be discharged from each of the plurality of discharge ports, wherein the control unit obtains a measurement result on a thickness of a cured material that has been actually supplied on the substrate in accordance with a first arrangement information as the arrangement information and formed using the member and the curing unit, and generates a second arrangement information as the arrangement information, by correcting the number of droplets of the uncured material in the first arrangement information, based on the obtained measurement result.

19. The apparatus according to claim 18, wherein the control unit determines a coefficient for correcting the number of droplets of the uncured material in the arrangement information such that a difference between the measured thickness of the cured material on the substrate and a target is reduced, and generates the second arrangement information by updating the arrangement information using the coefficient.

20. The apparatus according to claim 19, wherein the control unit updates the arrangement information by dividing the number of droplets of the uncured material in the arrangement information by the coefficient.

21. The apparatus according to claim 19, wherein the control unit determines the coefficient using a plurality of measurement results, the plurality of measurement results include a first measurement result on a thickness of the cured material that has been actually supplied on the substrate in accordance with the first arrangement information, and a second measurement result on a thickness of the cured material that has been actually supplied on the substrate in accordance with other arrangement information, and the number of droplets of the uncured material is different in the first arrangement information and the other arrangement information.

22. The apparatus according to claim 21, wherein the first measurement result is obtained from the cured material that has been supplied on the substrate in accordance with the first arrangement information and cured using a first member, and the second measurement result is obtained from the cured material that has been supplied on the substrate in accordance with the other arrangement information and cured using another member, and the first member and the another member include concave-convex patterns, respectively, and depths of concave portions in the concave-convex patterns are different in the first member and the another member.

23. The apparatus according to claim 21, wherein the first measurement result is obtained from the cured material that has been supplied on the substrate in accordance with the first arrangement information and cured using a third member, and the second measurement result is obtained from the cured material that has been supplied on the substrate in accordance with the other arrangement information and cured using the third member.

24. The apparatus according to claim 19, wherein the control unit generates fourth arrangement information to be used for a fourth member, the fourth arrangement information being different from the arrangement information used to determine the coefficient, by correcting the number of droplets of the uncured material obtained based on design information of the pattern of the fourth member by the coefficient.

25. The apparatus according to claim 18, wherein the control unit obtains the measurement result based on design information of a pattern of the member and a measurement value of a thickness of the pattern of the imprint material that has been actually supplied on the substrate in accordance with the arrangement information and formed using the member.

26. The apparatus according to claim 18, wherein the arrangement information is generated based on an ideal volume of the uncured material to be discharged from each of the plurality of discharge ports in one-time discharge and design information of the pattern of the member.

27. The apparatus according to claim 18, further comprising a measurement unit configured to measure a thickness of the cured material that has been supplied on the substrate and cured using the member.

28. The apparatus according to claim 18, wherein the control unit updates the arrangement information in a case where a difference between the measured thickness of the cured material and a target thickness is equal to or larger than a threshold.

29. The apparatus according to claim 18, wherein the control unit generates the second arrangement information by updating the arrangement information such that the number of droplets of the cured material from the plurality of discharge ports is changed overall in the arrangement information.

30. The apparatus according to claim 18, wherein the control unit generates the second arrangement information by updating, based on the measurement result, the arrangement information for each of a plurality of portions where the thicknesses of the cured material are different from each other on the substrate.

31. The apparatus according to claim 19, wherein the control unit determines, based on the measurement result, the coefficient for each of a plurality of portions where the thicknesses of the cured material are different from each other on the substrate.

32. The apparatus according to claim 19, wherein the control unit generates an arrangement information to be used for another member different from the member used to determine the coefficient, by correcting, by the coefficient, the number of droplets of the uncured material from the plurality of discharge ports obtained based on design information of the another member.

33. An apparatus which forms a film by curing an uncured material in a state of bringing a member and an uncured material on a substrate into contact with each other and by separating the cured material and the member from each other, the apparatus comprising:
 a supply unit including a plurality of discharge ports, each of the plurality of discharge ports discharges the uncured material toward the substrate, and configured to supply the uncured material on the substrate by discharging the uncured material from each of the plurality of discharge ports;
 a curing unit configured to cure the uncured material in a state in which the member is brought into contact with the uncured material; and a control unit configured to control the discharge of the uncured material from each of the plurality of discharge ports in accordance with arrangement information showing an arrangement, on the substrate, of the uncured material to be discharged from each of the plurality of discharge ports,
 wherein the control unit
 determines a coefficient for correcting the number of droplets of the uncured material from the plurality of discharge ports in first arrangement information showing an arrangement, on the substrate, of the uncured material to be discharged from each of the plurality of discharge ports, based on a measurement result on a thickness of a cured material that has been actually supplied on the substrate in accordance with the first arrangement information and cured using a first member as the member and the curing unit, and
 generates second arrangement information, showing an arrangement, on the substrate, of the uncured material to be discharged from each of the plurality of discharge ports, to be used for a second member, the second arrangement information different from the first arrangement information used to determine the coefficient, by correcting the number of droplets of the uncured material obtained based on design information of the second member by the coefficient.

34. An apparatus which forms a film by curing an uncured material in a state of bringing a member and an uncured material on a substrate into contact with each other and by separating the cured material and the member from each other, the apparatus comprising:
 a supply unit including a plurality of discharge ports, each of the plurality of discharge ports discharges the uncured material toward the substrate, and configured to supply the uncured material on the substrate by discharging the uncured material from each of the plurality of discharge ports;
 a curing unit configured to cure the uncured material in a state in which the member is brought into contact with the uncured material; and
 a control unit configured to control the discharge of the uncured material from each of the plurality of discharge ports in accordance with arrangement information showing an arrangement, on the substrate, of the uncured material to be discharged from each of the plurality of discharge ports,
 wherein the control unit
 determines a coefficient for correcting the number of droplets of the uncured material in first arrangement information, showing an arrangement, on the substrate, of the uncured material to be discharged from each of the plurality of discharge ports, generated for a first member as the member, based on a total amount of the uncured material that has been actually supplied on the substrate in accordance with the first arrangement information, and a product of an ideal volume of the uncured material to be discharged from each of the plurality of discharge ports in one time discharge and the number of droplets of the uncured material in the first arrangement information, and
 generates second arrangement information, showing an arrangement, on the substrate, of the uncured material to be discharged from each of the plurality of discharge ports, to be used for a second member as the member different from the first member, by correcting the number of the droplets of the uncured material determined based on the ideal volume and design information of the second member by the coefficient.

\* \* \* \* \*